(12) United States Patent
Wang et al.

(10) Patent No.: US 10,747,114 B2
(45) Date of Patent: *Aug. 18, 2020

(54) BLOCKING LAYER MATERIAL COMPOSITION AND METHODS THEREOF IN SEMICONDUCTOR MANUFACTURING

(71) Applicant: Taiwan Semiconductor Manufacturing Co., Ltd., Hsin-Chu (TW)

(72) Inventors: Siao-Shan Wang, Tainan (TW); Chen-Yu Liu, Kaohsiung (TW); Ching-Yu Chang, Yilang County (TW); Chin-Hsiang Lin, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/549,461

(22) Filed: Aug. 23, 2019

(65) Prior Publication Data

US 2019/0384177 A1   Dec. 19, 2019

Related U.S. Application Data

(63) Continuation of application No. 15/597,309, filed on May 17, 2017, now Pat. No. 10,394,123.

(51) Int. Cl.
| | | |
|---|---|---|
| *G03F 7/20* | (2006.01) | |
| *G03F 7/09* | (2006.01) | |
| *H01L 21/027* | (2006.01) | |
| *G03F 7/095* | (2006.01) | |
| *G03F 7/038* | (2006.01) | |
| *G03F 7/039* | (2006.01) | |
| *G03F 7/16* | (2006.01) | |

(Continued)

(52) U.S. Cl.
CPC ............ *G03F 7/2002* (2013.01); *G03F 7/038* (2013.01); *G03F 7/039* (2013.01); *G03F 7/091* (2013.01); *G03F 7/094* (2013.01); *G03F 7/095* (2013.01); *G03F 7/11* (2013.01); *G03F 7/162* (2013.01); *G03F 7/168* (2013.01); *G03F 7/2022* (2013.01); *G03F 7/322* (2013.01); *G03F 7/327* (2013.01); *G03F 7/38* (2013.01); *G03F 7/422* (2013.01); *H01L 21/0274* (2013.01)

(58) Field of Classification Search
CPC ....................................................... G03F 7/094
See application file for complete search history.

(56) References Cited

U.S. PATENT DOCUMENTS

| | | |
|---|---|---|
| 8,796,666 B1 | 8/2014 | Huang et al. |
| 9,012,132 B2 | 4/2015 | Chang |

(Continued)

*Primary Examiner* — Kathleen Duda
(74) *Attorney, Agent, or Firm* — Haynes and Boone, LLP

(57) ABSTRACT

The present disclosure provides a method for lithography patterning in accordance with some embodiments. The method includes forming a material layer on a substrate; forming a blocking layer on the material layer, wherein a bottom portion of the blocking layer reacts with the material layer, resulting in a capping layer that seals the material layer from an upper portion of the blocking layer. The method further includes forming a photoresist layer on the blocking layer; exposing the photoresist layer; and developing the photoresist layer, resulting in a patterned photoresist layer.

20 Claims, 5 Drawing Sheets

(51) Int. Cl.
*G03F 7/32* (2006.01)
*G03F 7/38* (2006.01)
*G03F 7/42* (2006.01)
*G03F 7/11* (2006.01)

(56) References Cited

U.S. PATENT DOCUMENTS

| | | |
|---|---|---|
| 9,028,915 B2 | 5/2015 | Change et al. |
| 9,093,530 B2 | 7/2015 | Huang et al. |
| 9,146,469 B2 | 9/2015 | Liu et al. |
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |
| 9,548,303 B2 | 7/2017 | Lee et al. |
| 10,394,123 B2 * | 8/2019 | Wang .................. G03F 7/039 |
| 2012/0329268 A1 | 12/2012 | Soda et al. |

* cited by examiner

BLOCKING LAYER MATERIAL COMPOSITION AND METHODS THEREOF IN SEMICONDUCTOR MANUFACTURING

PRIORITY

This is a continuation application of U.S. patent application Ser. No. 15/597,309, filed May 17, 2017, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

The decreased geometry sizes lead to challenges in semiconductor manufacturing. For example, an organic layer used as an under layer in a lithography process may have compositions (e.g., monomers or polymers) dissolved in solvents from another layer coated above it (e.g., a middle layer or a photoresist layer), resulting in intermixed boundaries between different material layers. As geometry sizes continue to decrease, fabrication process tolerances are reduced, and the impact from intermixed boundaries will limit process windows such as exposing or etching process windows and further limit the critical dimension of a resist pattern formed in the lithography process.

Therefore, while traditional lithography process methods have been generally adequate for their intended purposes, they have not been entirely satisfactory in every aspect. It is desired to have a lithography method to address the above issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C-1, 2C-2, 2D, 2E-1, 2E-2, 2F, 2G, 2H, 2I, and 2J illustrate cross-sectional views of forming a target pattern according to the method of FIG. 1, in accordance with some embodiments.

DETAILED DESCRIPTION

Figure 1:
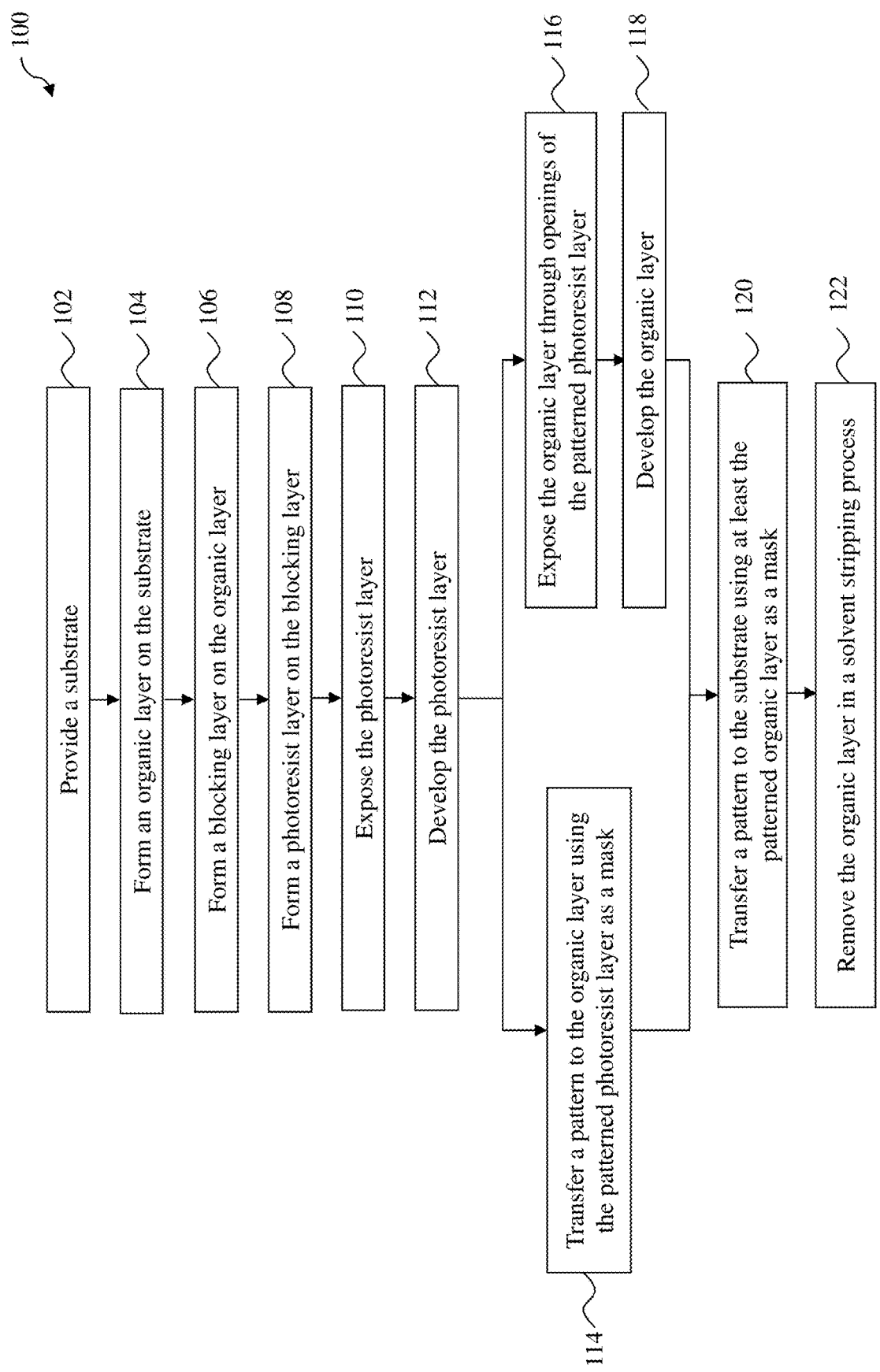
FIG. 1 illustrates a flow chart of a lithography patterning method according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to using a blocking layer to isolate an organic layer from other layers formed above that may partially dissolve the organic layer if in direct contact.

During semiconductor manufacturing, a wide variety of organic materials may be deposited or formed on substrates. During processes, organic materials may be removed, cleaned, or stripped with methods including dry methods, such as dry ashing or plasma ashing, and wet methods, such as solvent stripping. Several drawbacks are associated with dry methods, such as radiation damages to the underlying substrate by using high-energy ions to remove organic materials and diffusion of impurities into the substrate due to relatively high temperature environments used in many dry methods. As a comparison, wet methods have the advantages of reducing substrate damage and corrosion, improving uniformity of processing across the substrate, and increasing substrate throughput, i.e., an increase in the number of substrates that can be processed simultaneously during one process cycle. But when organic material hardens, such as cross-linking reactions occur among monomers or polymers in organic materials (e.g., due to high temperature), wet methods may have difficulties in removing hardened organic materials. This results in incomplete removal of organic materials on substrate surface and/or leaving organic material residuals on small features. It is desired to use organic material that has monomers or polymers free of cross-links, also referred to as un-cross-linked organic material, to apply with wet methods such as solvent stripping in removal steps. However, such monomers or polymers may be dissolved in solvents from an adjacent material layer formed above the organic material layer. For example, an organic material layer as an etching mask may intermix with a photoresist layer coated above it at the interface between the two layers, or the organic material layer as an under layer may intermix with a middle layer coated above it in a tri-layer patterning scheme. The intermixing blurs the boundaries of the material layers and limits process windows, such as degrading the imaging resolution in an exposure.

An object of the present disclosure is to provide new and improved material layer compositions that can be used as a blocking layer to prevent the organic layer from intermixing with other material layers, which helps to achieve high pattern fidelity in advanced lithography processes including deep ultraviolet (DUV) lithography, extreme ultraviolet (EUV) lithography, and e-beam lithography, while maintaining removal effectiveness of organic materials in a solvent stripping process.

FIG. 1 is a flow chart of a method 100 of patterning a substrate (e.g., a semiconductor wafer) according to various aspects of the present disclosure. The method 100 may be implemented, in whole or in part, by a system employing deep ultraviolet (DUV) lithography, extreme ultraviolet (EUV) lithography, electron beam (e-beam) lithography, x-ray lithography, ion beam lithography, and other lithography processes. Additional operations can be provided before, during, and after the method 100, and some operations described can be replaced, eliminated, or moved around for additional embodiments of the method. The method 100 is an example, and is not intended to limit the present disclosure beyond what is explicitly recited in the claims.

In the following discussion, the method 100 is described in conjunction with FIGS. 2A-2J, 3A, and 3B, wherein a semiconductor device 200 is fabricated by using embodiments of the method 100. The semiconductor device 200 may be an intermediate device fabricated during processing of an IC, or a portion thereof, that may comprise static random access memory (SRAM) and/or logic circuits, passive components such as resistors, capacitors, and inductors, and active components such as diodes, field-effect transistors (FETs), p-type FETs (PFETs), n-type FETs (NFETs), fin-like FETs (FinFETs), other three-dimensional (3D) FETs, metal-oxide-semiconductor FETs (MOSFET), complementary MOSFETs (CMOS), bipolar transistors, high voltage transistors, high frequency transistors, other memory cells, and combinations thereof.

Figure 2A:
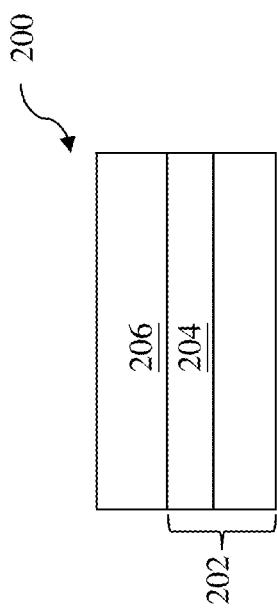

Referring now to FIG. 1, the method 100 receives (or is provided with) a substrate 202 at operation 102. Referring to FIG. 2A, the substrate 202 includes one or more layers of material or composition. In an embodiment, the substrate 202 is a semiconductor substrate (e.g., wafer). In another embodiment, the substrate 202 includes silicon in a crystalline structure. In alternative embodiments, the substrate 202 includes other elementary semiconductors such as germanium; a compound semiconductor such as silicon carbide, gallium arsenide, indium arsenide, and indium phosphide; an alloy semiconductor such as GaAsP, AlInAs, AlGaAs, InGaAs, GaInP, and/or GaInAsP; or combinations thereof. The substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers. In the present embodiment, the substrate 202 includes a patterning layer 204. In an embodiment, the patterning layer 204 is a hard mask layer including material(s) such as amorphous silicon (a-Si), silicon oxide, silicon nitride (SiN), titanium nitride, or other suitable material or composition. In an embodiment, the patterning layer 104 is an anti-reflection coating (ARC) layer such as a nitrogen-free anti-reflection coating (NFARC) layer including material(s) such as silicon oxide, silicon oxygen carbide, or plasma enhanced chemical vapor deposited silicon oxide. In various embodiments, the patterning layer 204 may include a high-k dielectric layer, a gate layer, a hard mask layer, an interfacial layer, a capping layer, a diffusion/barrier layer, a dielectric layer, a conductive layer, other suitable layers, and/or combinations thereof. The patterning layer 204 may be formed over the substrate 202 by one or more deposition techniques such as physical vapor deposition, chemical vapor deposition, and atomic layer deposition.

In an alternative embodiment, the substrate 202 is a mask substrate that may include a low thermal expansion material such as quartz, silicon, silicon carbide, or silicon oxide-titanium oxide compound. To further this example, the substrate 202 may be a mask substrate for making a deep ultraviolet (DUV) mask, an extreme ultraviolet (EUV) mask, or other types of masks.

Still referring to FIGS. 1 and 2A, the method 100 forms a material layer 206 on the substrate 202 at operation 104. In various embodiments, the material layer 206 contains an organic material that is patternable. Therefore, the material layer 206 is also referred to as the organic layer 206. The organic layer 206 may further include a solvent mixed (blended) with the organic material. In the present embodiment, the solvent is an organic solvent and the organic material is soluble in the organic solvent. The organic layer 206 may be disposed by a suitable technique, such as spin-on coating, knife-over-edge coating, spray coating, slot-die coating, rotogravure printing, screen printing or other suitable techniques.

According to various aspects of the present disclosure, the organic layer 206 constitutes an under layer of a tri-layer patterning scheme. Such tri-layer patterning scheme will be used to perform a lithography process.

The organic material in the organic layer 206 may include a plurality of monomers or polymers that are not cross-linked. It is desired that no cross-linking treatment is performed to the organic layer 206 during the lithography process. Cross-linking treatment means that the material being treated is subjected to a condition, such as a high temperature baking in a temperature range of a few hundred degrees Celsius, which triggers the molecules in the material such as monomers or polymers to cross-link. Cross-linked molecules greatly increase the strength or hardness of the material. Consequently, had the organic layer 206 been subjected to a cross-linking treatment, the materials therein would have been intentionally cross-linked, and the layer 206 would harden and become difficult to remove in a solvent stripping process. However, according to the various aspects of the present disclosure, no cross-linking treatment is intentionally performed to the organic layer 206, and the organic layer 206 remains removable in a solvent stripping process. Further, the organic layer 206 does not dissolve in an aqueous solution in the present embodiment.

Figure 2B:
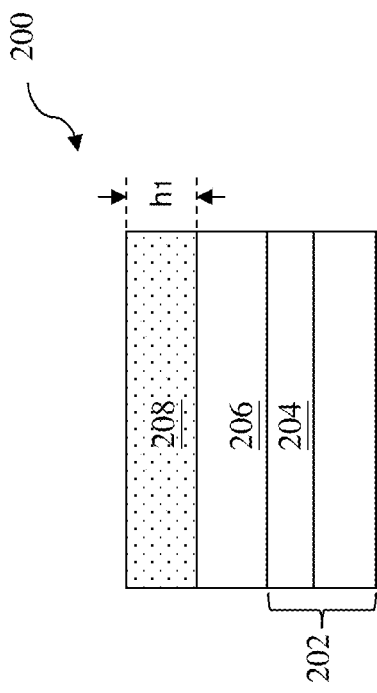

At operation 106, the method 100 (FIG. 1) forms a blocking layer 208 on the organic layer 206 (FIG. 2B). In an embodiment, the blocking layer 208 is formed by spin-on coating a liquid polymeric material over the organic layer 206. The blocking layer 208 has a thickness $h_1$. In some embodiments, the thickness $h_1$ is larger than 10 nm.

The blocking layer 208 constitutes a middle layer of the tri-layer patterning scheme of the present disclosure. In some embodiments, the blocking layer 208 comprises a polymer dissolved in a water-based (aqueous) solution. Examples for the polymer include polyacrylamides, polyamines, polyacrylates, polyethylene oxide, polyethyleneimines, and polyamidoamines. The solution may include a water miscible solvent, which can be selected from a group of ($C_1$-$C_8$) alcohols, diols, monoalkyl ethers, ethylene glycol monoalkyl ether acetate, propylene glycol monomethyl ether acetate (PGMEA), and a combination thereof. The blocking layer 208 may additionally contain additives, such as one or more surfactants to help reduce the surface tension of the blocking layer 208 and improve coating uniformity. For example, the surfactant may be anionic, nonionic, or hydrotropic. In furtherance of some embodiments, the blocking layer 208 includes tuning monomers, which comprise an aromatic group that modifies the characteristics (such as extinction coefficient κ and refractive index n) of the blocking layer 208. Examples for the aromatic group include benzene, benzoic acid, acetophenone, methyl benzoate, phenol, naphthalene, and anthracene. Since organic layer 206 does not dissolve in an aqueous solution, material interfaces between the organic layer 206 and the blocking layer 208 would not intermix. The blocking layer 208 thereby seals the organic layer 206 from other layers to be formed above.

In some embodiments, the blocking layer 208 comprises a reactive monomer dissolved in an organic solution. The organic solution may include a single solvent or a mixture of solvents selected from a group of isobutyl acetate, n-butyl acetate, 2-heptanone, and PGMEA. It should be noted that above solvents are given as examples in the present disclosure, embodiments of the method are not limited to the application of these solvents. Any other chemical solvents may be suitably used. The reactive monomer includes one or more reactive sites so that it can be attached or bonded to the surface of the organic layer 206. For example, a reactive monomer may have reactions with the surface of the organic layer 206 and creates one or more chemical bonds (e.g., hydrogen bonds) that attach the reactive monomer to the surface of the organic layer 206. Even though the blocking layer 208 includes organic solution that may dissolve the organic layer 206, the reactive monomers attached to the surface of the organic layer 206 form a capping layer that blocks the organic solution in direct contact with the organic layer 206. The organic layer 206 is thereby sealed from other layers to be formed above. The other portions of the blocking layer 208 that are not bonded to the surface of the organic layer 206 may still be dissolved in organic solvents, including organic solvents used in other layers to form above the blocking layer 208, such as propylene glycol monomethyl ether (PGME), OK73 (70% PGME+30% PGMEA), and alcohol. This feature is useful in reducing the thickness $h_1$ of the blocking layer 208, which will be explained in details later with operation 108.

In some examples, the reactive monomer may include one or more functional groups containing nitrogen, such as a primary amine, a secondary amine, a tertiary amine, or an N-heterocyclic group. In some examples, the reactive monomer includes hydroxyl group. In some embodiments, the reactive monomer may interact with an acid. For example, the reactive monomer may include a base such as a monomer having a given basicity. For example, the reactive monomer may be a monomer blended in the organic solution, such as a photo-decomposable base (PDB). Thus, in some embodiments, the acid dissociation constant ($pK_a$) of the blocking layer 208 is greater than 4 and less than 13. In at least some embodiments, the $pK_a$ of the blocking layer 208 is greater than 5 and less than 10. The blocking layer 208 may also include tuning monomers, which comprise an aromatic group that modifies the extinction coefficient κ and refractive index n of the blocking layer 208. Examples for the aromatic group include benzene, benzoic acid, acetophenone, methyl benzoate, phenol, naphthalene, and anthracene. Additionally, the blocking layer 208 may comprise a polymer, which has a polymer backbone that both reactive monomers and tuning monomers are bonded to.

In some embodiments, the polymer in the blocking layer 208 may be represented as any one of the formulas (a)-(c) below:

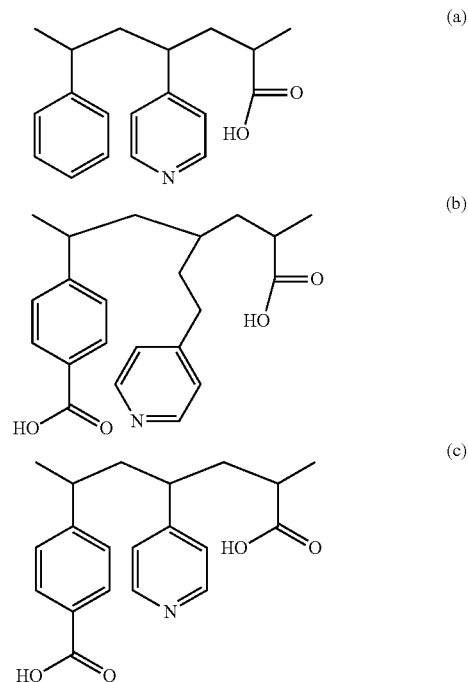

In the formulas (a)-(c), the polymer includes —COOH functional group. Adjusting the loading of —COOH functional group on the polymer backbone may tune the solubility of the polymer in solvents.

Figures 1, 2C:
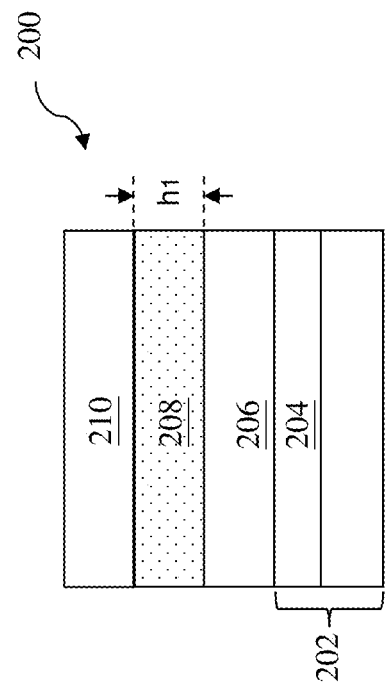
Figures 2, 2C:
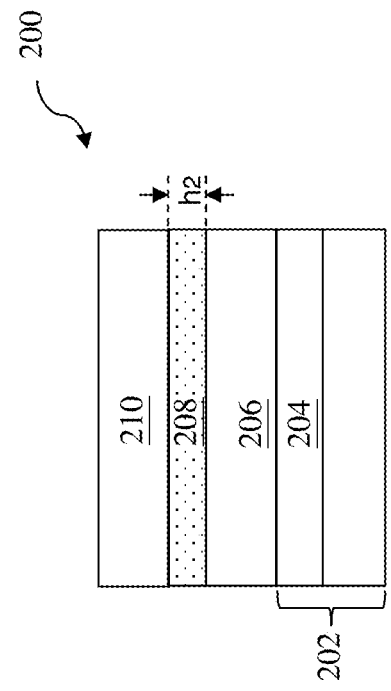

At operation 108, the method 100 (FIG. 1) forms a photoresist (or resist) layer 210 over the substrate 202, and particularly over the blocking layer 208 in the present embodiment. The resist layer 210 may constitute an upper layer of the tri-layer patterning scheme discussed above. Referring to FIGS. 2C-1 and 2C-2, in various embodiments, the resist layer 210 is formed by spin-on coating a liquid polymeric material over the blocking layer 208. In an embodiment, the blocking layer 208 maintains its height $h_1$ after the resist layer 210 is stacked above it (e.g., the blocking layer 208 does not dissolve during the formation of the resist layer 210), as shown in FIG. 2C-1. In an embodiment, the blocking layer 208's height $h_1$ decreases to $h_2$ during the forming of the resist layer 210, as shown in FIG. 2C-2. For example, the blocking layer 208 may have reactive monomers dissolved in an organic solution, and upper portions of the blocking layer 208 that are not bonded to the surface of the organic layer 206 may be partially dissolved in organic solvents in the resist layer 210 and washed away during a spin-on coating process. Alternatively, the upper portions of the blocking layer 208 may be washed away by a pre-treatment solvent (e.g., a reduced resist consumption (RRC) solvent) before applying the resist material. For the convenience of discussion, the blocking layer 208 with a reduced thickness $h_2$ as shown in FIG. 2C-2 is used as an example for subsequent operations. Persons having ordinary skill in the art should recognize that the blocking layer 208 with the thickness $h_1$ as shown in FIG. 2C-1 can also be used for the subsequent operations.

In some embodiments, it is desired to reduce the thickness of the blocking layer 208. The thickness of the resist layer 210 is correlated with the thicknesses of the blocking layer 208. In traditional fabrication processes using a conventional tri-layer patterning scheme, the middle layer is formed by spin-on coating and is therefore somewhat thick. Consequently, the photoresist layer formed thereabove would tend to be thick too. In other words, as the blocking layer 208 becomes thicker, so does the resist layer 210. Meanwhile, as the device scaling down process continues, the patterns on the wafer have ever smaller lateral dimensions, thereby leading to smaller lateral dimensions (i.e., widths) for the resist patterns as well. As a result, an aspect ratio (height divided by width) of the resist patterns increase. It is difficult to form and maintain resist patterns with high aspect ratios, and the resist patterns with high aspect ratios may have a greater risk of collapsing, which leads to fabrication defects. In an embodiment, upper portions of the blocking layer 208 that are not bonded to the surface of the organic layer 206 are partially washed away by organic solvents of the resist layer or an RCC solvent. The thickness $h_2$ may be below 10 nm. In another embodiment, upper portions of the blocking layer 208 that are not bonded to the surface of the organic layer 206 are mostly or substantially completely washed away by organic solvents in the resist layer 210 or RCC solvent. The thickness $h_2$ may therefore be below 1 nm.

In an embodiment, the resist layer 210 is sensitive to a radiation, such as an I-line light, a DUV light (e.g., 248 nm radiation by krypton fluoride (KrF) excimer laser or 193 nm radiation by argon fluoride (ArF) excimer laser), a EUV light (e.g., 13.5 nm light), an e-beam, an x-ray, and an ion beam. The resist layer 210 may be a negative tone development (NTD) resist, i.e., its solubility in a developer decreases upon the radiation. An example of the resist used in an NTD process is a polymeric material including cross-linkable polymer and cross-linkers, where the polymer molecules cross-link upon radiation. Alternatively, the resist layer 210 may be a positive tone development (PTD) resist, i.e., its solubility in a developer increases upon the radiation. An example of the resist used in a PTD process is a chemically amplified resist (CAR) having one or more acid labile groups (ALG) and photo-acid generators (PAG) that produce an acid upon radiation. The acid cleaves the ALGs off the polymeric material in a chemical amplification reaction.

Figure 2D:
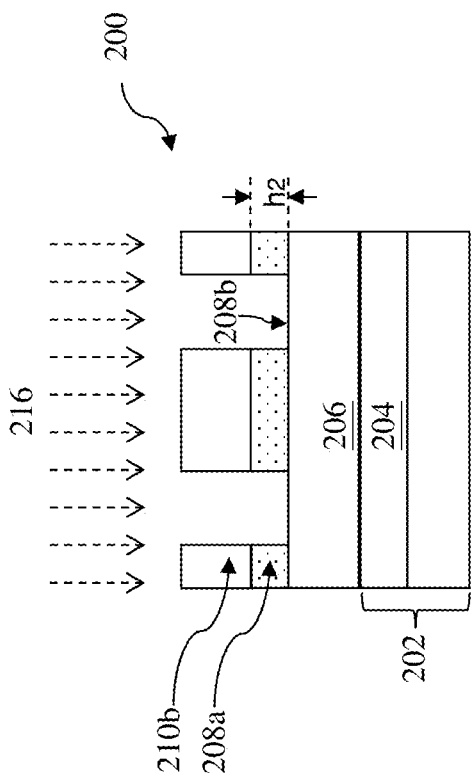

At operation 110, the method 100 (FIG. 1) exposes the resist layer 210 to a radiation beam 212 in a lithography system (FIG. 2D). Some portions 210a (shaded areas) of the resist layer 210 are exposed by the radiation beam 212, and other portions 210b of the resist layer 210 remain unexposed. The radiation beam 212 may be an I-line light (365 nm), a DUV radiation such as KrF excimer laser (248 nm) or ArF excimer laser (193 nm), a EUV radiation (e.g., 13.5 nm), an e-beam, an x-ray, an ion beam, or other suitable radiations. Operation 110 may be performed in air, in a liquid (immersion lithography), or in a vacuum (e.g., for EUV lithography and e-beam lithography). In an embodiment, the radiation beam 212 is patterned with a mask 214, such as a transmissive mask or a reflective mask, which may include resolution enhancement techniques such as phase-shifting and/or optical proximity correction (OPC). The mask 214 includes various patterns for forming IC features in or on the substrate 202. In another embodiment, the radiation beam 212 is directly modulated with a predefined pattern, such as an IC layout, without using a mask (e.g., maskless lithography using e-beam). In an embodiment, the operation 110 includes soft baking the resist layer 210 before the exposure and/or post-exposure baking the resist layer 210 after the exposure, while the baking temperatures are controlled to be not high enough to trigger cross-linking reactions in the organic layer 206.

Figures 1, 2E:
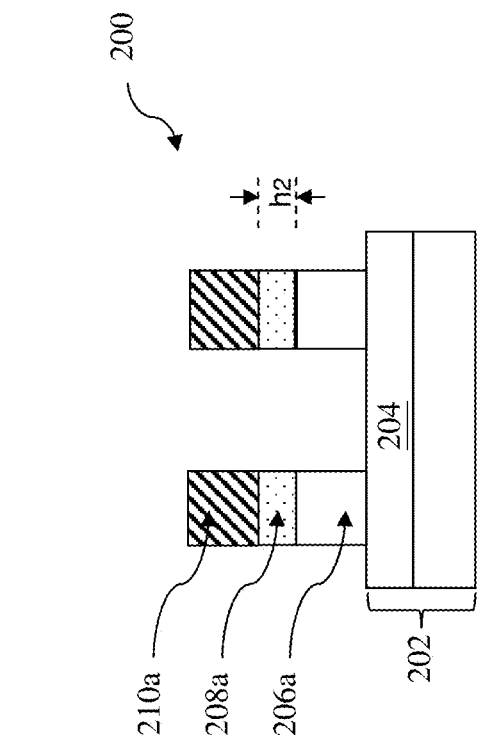
Figures 2, 2E:
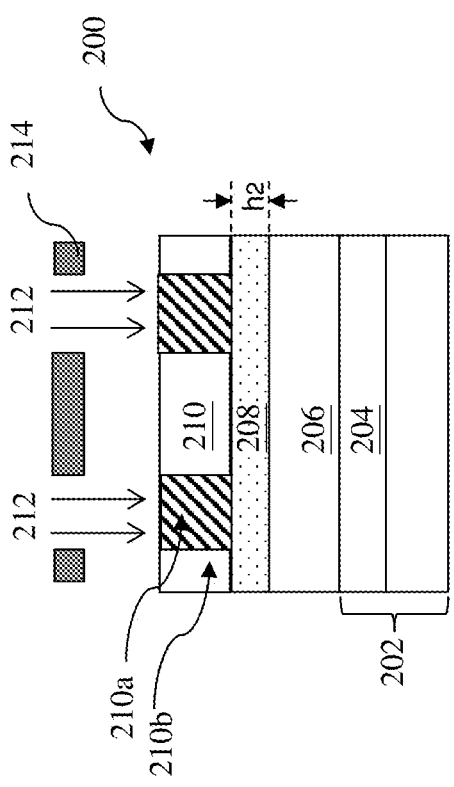

Referring to FIGS. 2E-1 and 2E-2, the operation 112 develops the exposed resist layer 210 in a developer 216 to form a resist pattern (also referred to as the resist pattern 210). The developer 216 may include an aqueous solvent or an organic solvent. Depending on the type of the resist layer 210 and the developer 216, either the exposed portions 210a are removed (e.g., in a PTD process as shown in FIG. 2E-1), or the unexposed portions 210b are removed (e.g., in an NTD process as shown in FIG. 2E-2). In either case, one or more openings are formed in the resist layer 210. Some portions 208b of the blocking layer 208 in the openings of the resist layer 210 are also removed in the developer 216, and portions 208a of the blocking layer 208 under the undeveloped resist layer 210 still remain. In some embodiments, operation 112 exposes the top surface of the organic layer 206 in the openings of the resist layer 210. In other embodiments, a thin layer 208b of polymers bonded to the top surface of the organic layer 206 is not removed by the developer 216 and still covers the organic layer 206 as a capping layer. For the convenience of discussion, the resist pattern 210 as shown in FIG. 2E-2 is used as an example for subsequent operations. Persons having ordinary skill in the art should recognize that the resist pattern 210 as shown in FIG. 2E-1 can also be used for the subsequent operations.

In some embodiments, the blocking layer 208 contains a polymer that is sensitive to the radiation used in exposing the resist layer 210. Referring back to FIG. 2D, during the exposure of the resist layer 210, a portion of the radiation beam 212 may reach the blocking layer 208 through the resist layer 210 and expose the blocking layer 208 as well. The polymer in the blocking layer 208 may have photo-switchable groups that change polarity during the exposure. The solubility of the blocking layer 208 in the developer 216 may thereby be adjusted.

Figure 3A:
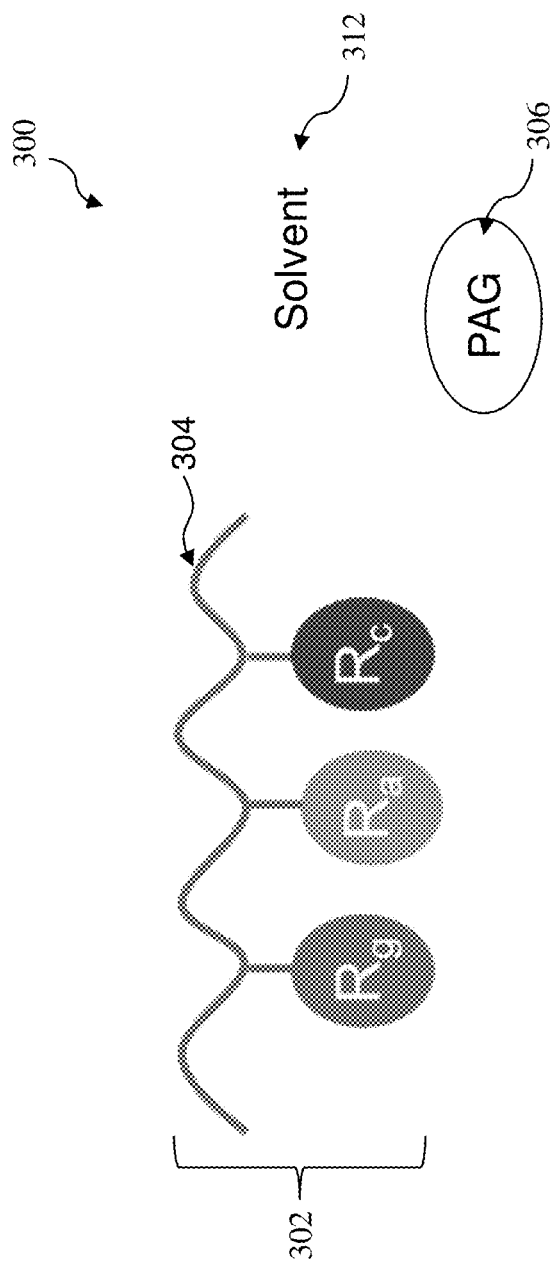
FIGS. 3A and 3B illustrate various aspects of material compositions in a blocking layer, in accordance with some embodiments.
Figure 3B:
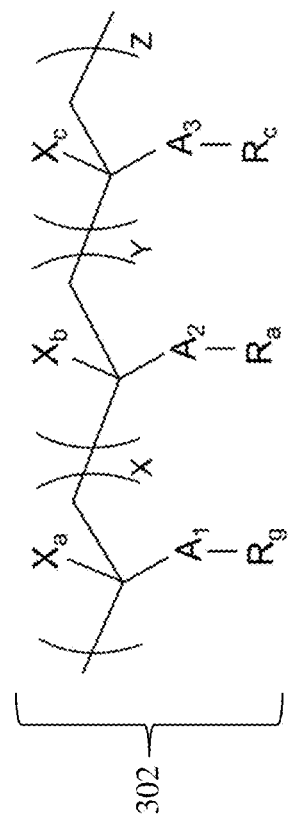

With reference to the example of FIGS. 3A and 3B, illustrated therein are a composition 300 in the blocking layer 208 and a radiation sensitive polymer 302, respectively, in accordance with some embodiments. The polymer 302 may include a polymer backbone 304, one or more reactive monomers ($R_g$), one or more photo-switchable monomers ($R_a$), one or more tuning monomers ($R_c$). Monomers $R_g$, $R_a$, and $R_c$ may be all bonded to the polymer backbone 304. In some embodiments, the reactive monomer ($R_g$) is a chelate group bonded to the polymer backbone 304. The chelate group may be a basicity monomer that creates one or more hydrogen bonds when in contact with the surface of the organic layer 206 to thereby form an isolation layer. In some embodiments, the chelate group may include functional groups like amine, amide, ester, hydroxyl, sulfonyl, or heterocyclic group. In furtherance of the embodiment, the chelate group may include at least one of a primary amine, a secondary amine, a tertiary amine, an $NH_3$ group, a pyridine group, a phenol group, and a cyano group (—CN). In some embodiments, the tuning monomer $R_c$ comprises an aromatic group that modifies the extinction coefficient κ and refractive index n of the blocking layer 208. Examples for the aromatic group include benzene, benzoic acid, acetophenone, methyl benzoate, phenol, naphthalene, and anthracene. In some embodiments, the photo-switchable monomer $R_a$ includes an acid labile group (ALG). The ALG functions as a dissolution inhibitor that can be cleaved by acids generated from photo acid generator (PAG) 306. The PAG 306 releases an acid upon radiation in exposed portions of the blocking layer 208. The acid may also be generated from auto-catalytical acid amplifier additives blended in the solvent 312. The material composition 300 may further include other additives, such as a sensitizer that generates a secondary radiation or electrons after receiving a main radiation (e.g., a EUV radiation) to trigger the PAG 306 to release an acid. Thus, the exposed portions of the blocking layer 208 will change its polarity and solubility. Furthermore, in an NTD process, the polarity and solubility change in the exposed portions of the blocking layer 208 may increase the blocking layer 208's adhesion to the bottom surface of the resist layer 210. This increased adhesion is desired as it improves the resist layer 210's collapse (peeling) window during the lithography process. In some embodiments, the photo-switchable monomer $R_a$ may be acid-cleavable cyclic and branched aliphatic, carbonyls, ester, oligomeric ester, ether, carbonate, or orthoester. In furtherance of the embodiments, the photo-switchable monomer $R_a$ is selected from a group of methyl cyclopentane, ethyl cyclopentane and methyl adamantane.

Referring again to FIG. 3B, and in some examples, a chemical structure of the polymer 302 may include the reactive monomer ($R_g$), the photo-switchable monomer ($R_a$), and the controller monomer ($R_e$) bonded to $A_1$, $A_2$ and $A_3$, respectively, where each of $A_1$, $A_2$ and $A_3$ may be COO— or PhO—. $A_1$, $A_2$ and $A_3$ may in turn be bonded to a chemical backbone as part of chemicals X, Y and Z, respectively. In some embodiments, the mole ratios of X to Y to Z are described by $X+Y+Z=1.0$, $0<X<1$, $0.1<Y<0.9$, and $0.25<Z<0.5$. $X_a$, $X_b$ and $X_c$, which are also bonded to the polymer backbone, may be hydrogen or methyl.

In some embodiments, the polymer 302 in the blocking layer 208 may be represented as any one of the formulas (d)-(l) below:

(d)
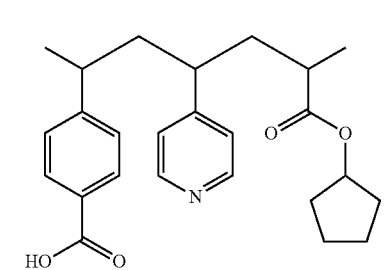

(e)
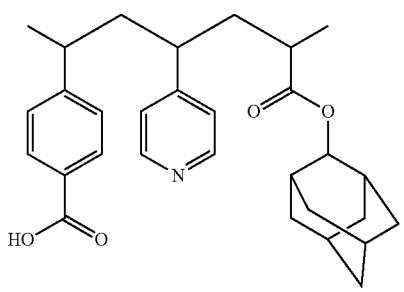

(f)
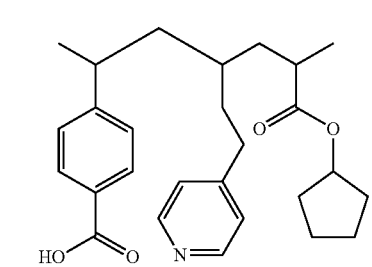

(g)
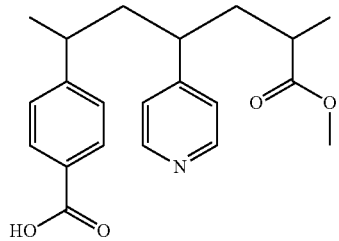

(h)
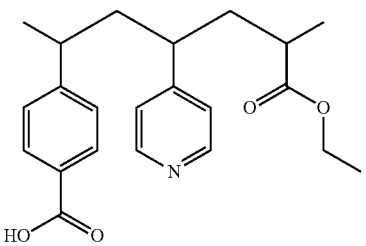

(i)
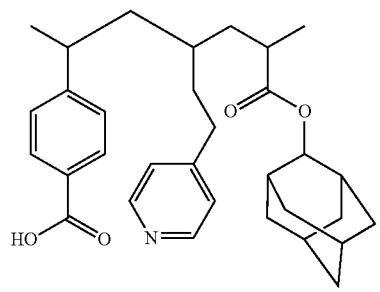

(j)
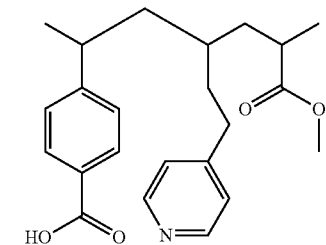

(k)
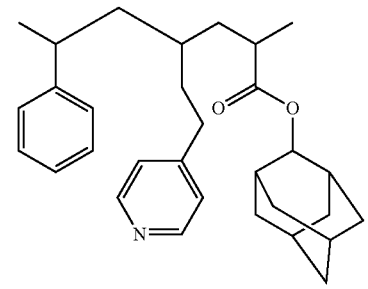

(l)
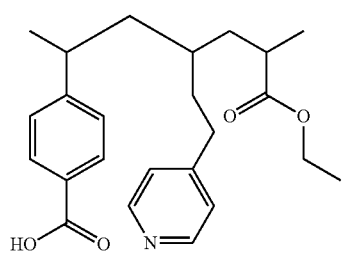

Figure 2F:
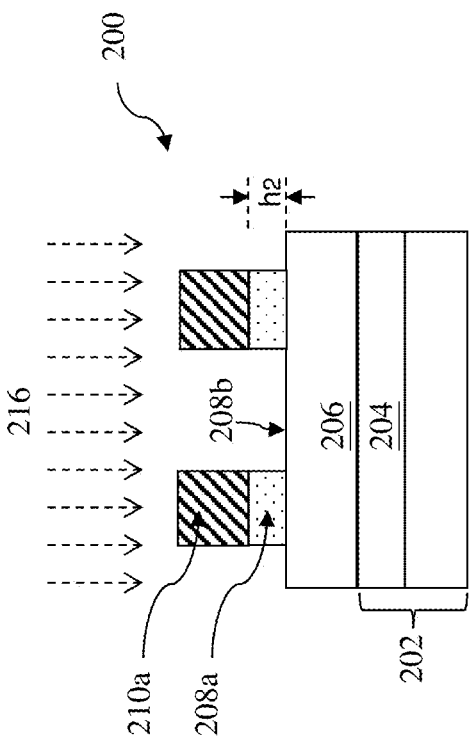

At operation 114, the method 100 (FIG. 1) transfer a pattern from the resist layer 210 to the organic layer 206 using the patterned resist layer 210 and the patterned blocking layer 208 as a mask (FIG. 2F). In various embodiments, the operation 114 is an etching process that selective etches the organic layer 206. The etching process may include dry etching, wet etching, or a combination thereof. In an example, the etching process includes a plasma etching process using an etchant having fluorine, such as $CF_2$, $CF_3$, $CF_4$, $C_2F_2$, $C_2F_3$, $C_3F_4$, $C_4F_4$, $C_4F_6$, $C_5F_6$, $C_6F_6$, $C_6F_8$, or a combination thereof. The resist pattern 210 may be partially consumed during the etching of the organic layer 206. After the operation 114, the method 100 may have an optional operation to strip off the remaining portions of the resist layer 210a and the blocking layer 208a, leaving the patterned organic layer 206a over the patterning layer 204.

In some embodiments, the organic layer 206 is a photoresist (or resist) layer as well. Therefore, the method 100 (FIG. 1) may exclude the operation 114 and proceed from operation 112 to operation 116 to perform a second exposing process to the organic layer 206 through openings of the patterned resist layer 210. By using two resist layers and double exposing process, the fidelity of the process window may be improve and a smaller critical dimension may be achieved. In an embodiment, the organic layer 210 is sensitive to a radiation, such as an I-line light, a DUV light, a EUV light, an e-beam, an x-ray, and an ion beam. Referring back to FIG. 2D, during the exposing of the resist layer 210, the radiation beam 212 does not expose the organic layer 206 simultaneously in an embodiment. For example, the organic layer 206 may be sensitive to a radiation wavelength different from the one in the radiation beam 212. For another example, the organic layer 206 and the resist layer 210 may have different exposure thresholds with respect to the radiation beam 212. For example, the organic layer 206 has a higher exposure threshold than the resist layer 210, and the energy dose of the radiation beam 212 is enough to expose the resist layer 210 but not enough to expose the organic layer 206. In yet another embodiment, the tuning monomers $R_c$ in the blocking layer 208 provides an attenuation mechanism that the radiation beam 212 is weakened when it reaches the organic layer 206 to below the exposure threshold required by the organic layer 206.

Figure 2H:
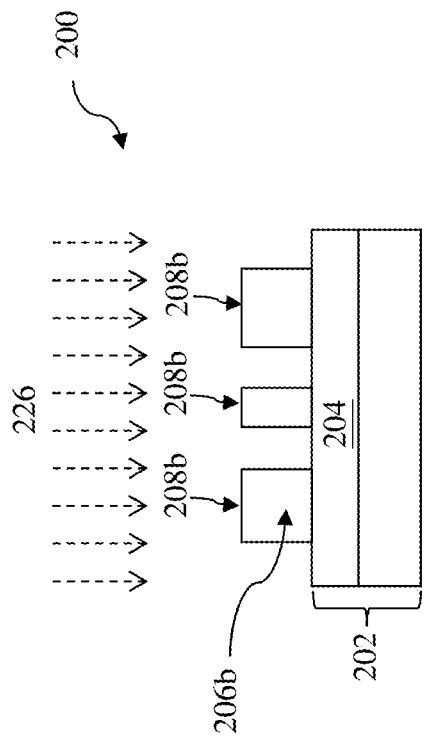
Figure 2J:
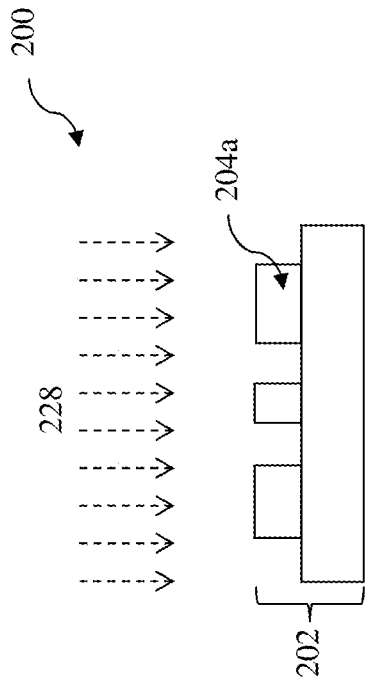
Figure 2G:
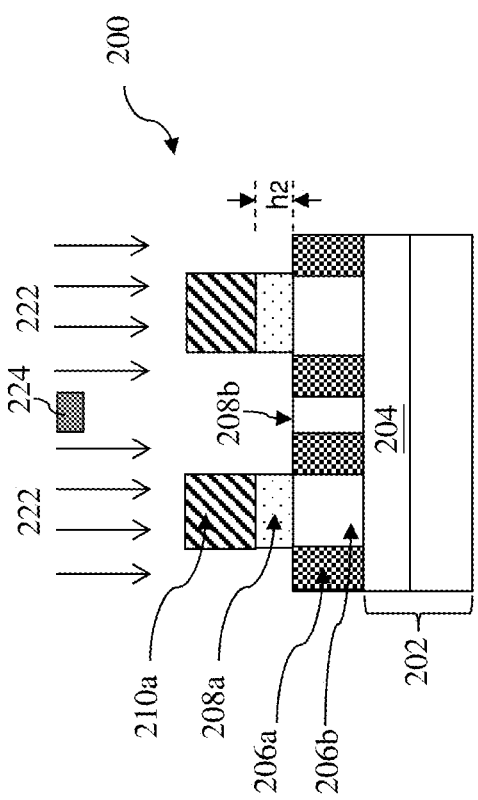

Referring to FIG. 2G, the method 100 exposes the organic layer 206 to a radiation beam 222 in a lithography system. Some portions 206a (shaded areas) of the organic layer 206 are exposed by the radiation beam 222 through openings of the patterned resist layer 210, and other portions 206b of the organic layer 206 remain unexposed. In an embodiment, the radiation beam 222 is patterned with a mask 224, such as a transmissive mask or a reflective mask. In another embodiment, the radiation beam 222 is directly modulated with a predefined pattern without using a mask (e.g., maskless lithography using e-beam).

At operation 118, the method 100 (FIG. 1) develops the exposed organic layer 206 in a developer 226 (FIG. 2H). The method 100 may have an optional operation to strip off the remaining portions of the resist layer 210a and the blocking layer 208a before developing the exposed organic layer 206. Alternatively, the stripping off the resist layer 210a and the blocking layer 208a may be performed after developing the exposed organic layer 206. Similar to the operation 112 discussed above in developing the resist layer 210, depending on the type of the organic layer 206 and the developer 226, either the exposed portions 206a are removed (e.g., in a PTD process) or the unexposed portions 206b are removed (e.g., in an NTD process) in the operation 118. FIG. 2H illustrates a PTD process, wherein the exposed portions 206a are removed. In some embodiments, a thin layer 208b of polymers bonded to the top surface of the organic layer 206 is not removed by the developer 226 and still covers the exposed portions 206b.

Figure 2I:
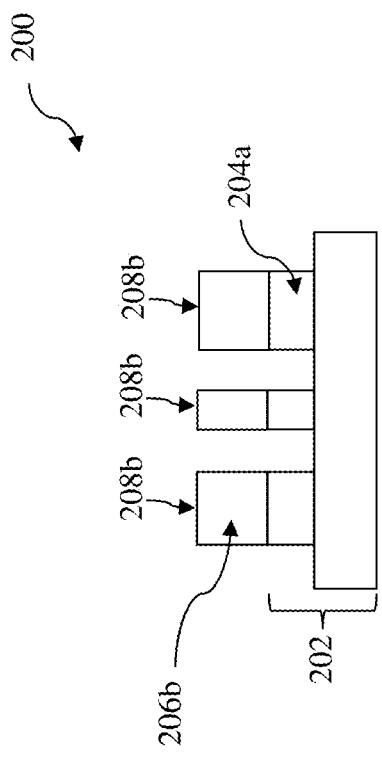

At operation 120, the method 100 (FIG. 1) etches the patterning layer 204 using the patterned organic layer 206 as an etching mask, thereby transferring the pattern to the patterning layer 204 (FIG. 2I). In an embodiment, the operation 120 further etches the substrate 202 using the patterned organic layer 206 as an etch mask. The operation 120 may use a dry (plasma) etching, a wet etching, or other suitable etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

At operation 122, the method 100 (FIG. 1) removes the patterned organic layer 206 in a solvent stripping process, leaving the patterning layer 204 over the substrate 202, as illustrated in FIG. 2J. In some embodiments, the solvent stripping process includes applying a solution 228 to the semiconductor device 200. In some embodiments, the solution 228 is formed by mixing tetramethyl ammonium hydroxide (TMAH) with a solvent, such as propylene glycol ethyl ether (PGEE) or PGEE with water. In some embodiments, the solvent stripping process includes applying sulfuric peroxide mixture (SPM) and applying ammonia peroxide mixture (APM). SPM includes a solution having sulfuric acid ($H_2SO_4$) and hydrogen peroxide ($H_2O_2$). APM includes a solution having ammonium hydroxide ($NH_4OH$), hydrogen peroxide ($H_2O_2$) and water ($H_2O$). The SPM and APM are applied to the semiconductor device 200 sequentially in either order according to various embodiments. In other embodiments, the solvent stripping process further includes applying a diluted hydrofluoric acid (DHF) to the semiconductor device 200.

Although not shown in FIG. 1, the method 100 may proceed to further processes in order to form a final pattern or device. For example, the method 100 may etch the substrate 202 with the patterning layer 204 as an etch mask. For another example, the method 100 may deposit additional layer(s) above the patterning layer 204 and perform patterning processes to the additional layer(s). For example, the method 100 may form shallow trench isolation (STI) features for defining transistor active regions, may form fin-like protrusions in the respective substrates for forming FinFETs, may form contact holes for transistor source/drain/gate contacts, and may form interconnect features.

Although not intended to be limiting, one or more embodiments of the present disclosure provide many benefits to semiconductor manufacturing processes. For example, the blocking layer constructed according to the present disclosure provides isolation to an organic layer, avoiding the organic layer to intermix with other layers formed above. The design of the polymer compounds allows a thin capping layer to form on the top surface of the organic layer to avoid the organic layer in direct contact with solvents from other layers. Further, the blocking layer material composition and methods thereof help improving process windows. Still further, the disclosed methods can be easily integrated into existing semiconductor manufacturing processes.

In one exemplary aspect, the present disclosure is directed to a method. The method includes forming a material layer over a substrate, wherein the material layer is soluble in a solvent; forming a blocking layer on the material layer;

forming a photoresist layer on the blocking layer, wherein the photoresist layer includes a photosensitive material dissolved in the solvent; exposing the photoresist layer; and developing the photoresist layer in a developer.

In another exemplary aspect, the present disclosure is directed to a method for lithography patterning. The method includes forming an organic layer over a substrate, the organic layer containing a material that is capable of being cross-linked but is subjected to a cross-linking operation; forming a blocking layer on the organic layer, wherein the portion of the blocking layer becomes attached to the organic layer; forming a photoresist layer on the blocking layer, wherein another portion of the blocking layer that is not attached to a top surface of the organic layer is removed by a solvent of the photoresist layer; performing an exposing process to the photoresist layer; developing the photoresist layer in a developer to result in a patterned photoresist layer, wherein the developer also partially removes the blocking layer; transferring a pattern in the developed photoresist layer to the organic layer; transferring the pattern to the substrate using the organic layer as a mask; and removing the organic layer in a solvent stripping process.

In another exemplary aspect, the present disclosure is directed to a method for lithography patterning. The method includes forming a first photoresist layer over a substrate; forming a blocking layer on the first photoresist layer, the blocking layer including a chelate group, an acid labile group, a polymer backbone, and a photo-acid generator, wherein the chelate group is attached to a top surface of the first photoresist layer; forming a second photoresist layer on the blocking layer, wherein a portion of the blocking layer that is not attached to the top surface of the first photoresist layer is removed by a solvent of the second photoresist layer; performing a first exposing process to the second photoresist layer; developing the second photoresist layer, thereby forming a patterned second photoresist layer; performing a second exposing process to the first photoresist layer through openings in the patterned second photoresist layer; developing the first photoresist layer, thereby forming a patterned first photoresist layer; transferring a pattern to the substrate using at least the patterned first photoresist layer as a mask; and removing the first photoresist layer in a solvent stripping process.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for lithography patterning, comprising:
    forming a material layer on a substrate;
    forming a blocking layer on the material layer, wherein a bottom portion of the blocking layer reacts with the material layer, resulting in a capping layer that seals the material layer from an upper portion of the blocking layer;
    forming a photoresist layer on the blocking layer;
    exposing the photoresist layer; and
    developing the photoresist layer, resulting in a patterned photoresist layer.

2. The method of claim 1, wherein the blocking layer includes an organic solution and the material layer is an organic layer that is dissolvable in the organic solution.

3. The method of claim 1, wherein the material layer is indissolvable in an aqueous solution.

4. The method of claim 1, wherein the blocking layer includes reactive monomers and the capping layer includes a layer of the reactive monomers bonded to a top surface of the material layer.

5. The method of claim 4, wherein the reactive monomers are bonded to the top surface of the material layer through hydrogen bonds.

6. The method of claim 4, wherein the reactive monomers include at least one of a primary amine, a secondary amine, a tertiary amine, a hydroxyl group, a photo-decomposable base (PDB), and a heterocyclic group containing nitrogen.

7. The method of claim 1, wherein the blocking layer includes an organic solvent.

8. The method of claim 1, wherein the blocking layer has an acid dissociation constant ($pK_a$) value greater than 5 and less than 10.

9. The method of claim 1, wherein during the forming of the photoresist layer, a thickness of the upper portion of the blocking layer is reduced.

10. The method of claim 1, wherein during the forming of the photoresist layer, the upper portion of the blocking layer is substantially removed.

11. The method of claim 1, wherein the material layer includes a photosensitive material, such that the material layer is capable to be developed in a lithography process, wherein the material layer and the photoresist layer have different sensitivities to radiation wavelengths or different exposure thresholds.

12. The method of claim 11, further comprising:
    exposing the material layer through openings of the patterned photoresist layer; and
    developing the material layer, resulting in a patterned material layer.

13. A method for lithography patterning, comprising:
    forming an organic layer over a substrate;
    forming a blocking layer on the organic layer, wherein a portion of the blocking layer becomes bonded to the organic layer;
    forming a photoresist layer on the blocking layer, wherein another portion of the blocking layer that is not bonded to the organic layer is at least partially dissolved in a solvent of the photoresist layer;
    performing an exposing process to the photoresist layer;
    developing the photoresist layer to result in a patterned photoresist layer;
    transferring a pattern in the patterned photoresist layer to the organic layer; and
    transferring the pattern to the substrate using the organic layer as a mask.

14. The method of claim 13, wherein the portion of the blocking layer is bonded to the organic layer through at least a reactive monomer.

15. The method of claim 14, wherein the blocking layer includes a polymer backbone, wherein the reactive monomer is bonded to the polymer backbone.

16. The method of claim 14, wherein the reactive monomer includes at least one of a primary amine, a secondary amine, a tertiary amine, an $NH_3$ group, a pyridine group, a phenol group, and a cyano group.

17. The method of claim 13, wherein the blocking layer includes a polymer represented as one of formulas (a), (b), (c), (d), (e), (f), (g), (h), (i), (j), (k), and (l) below:
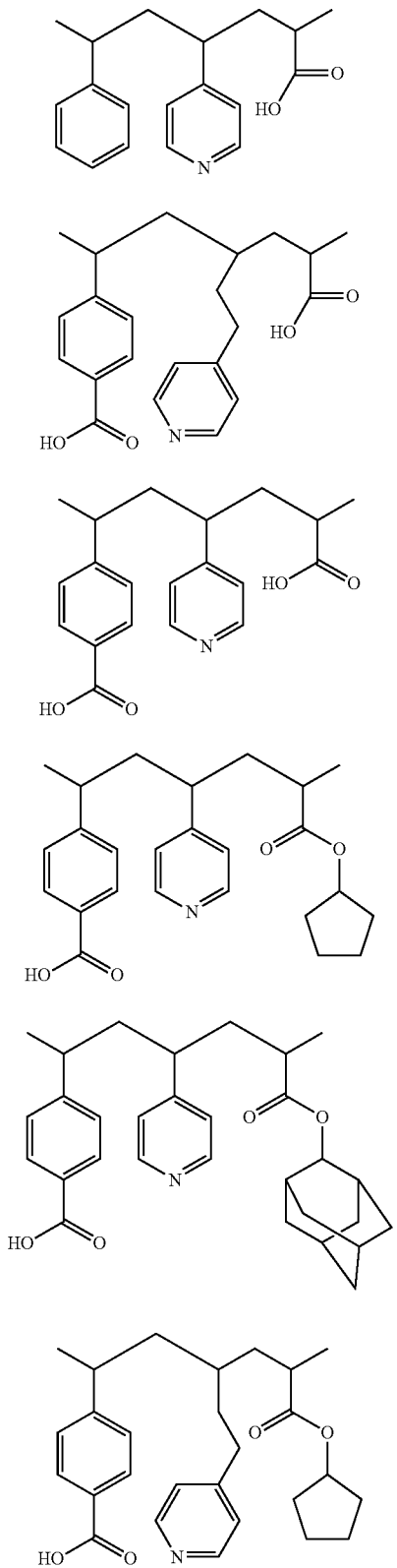
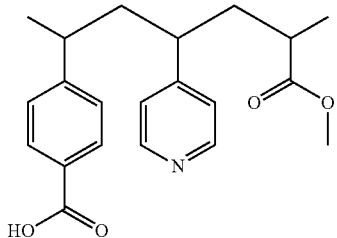
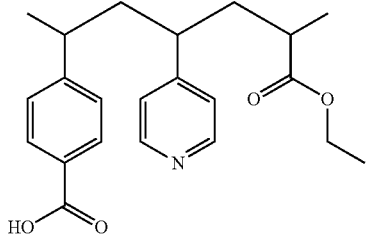
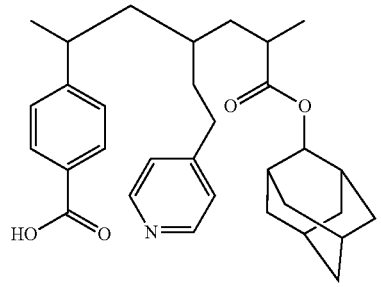
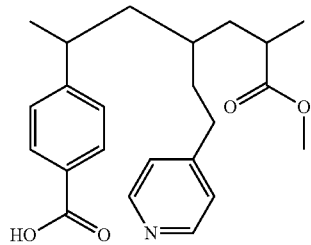
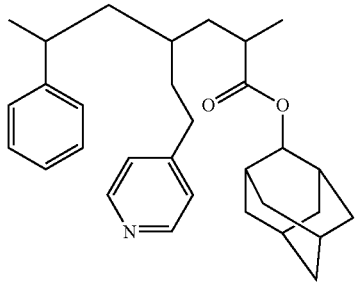
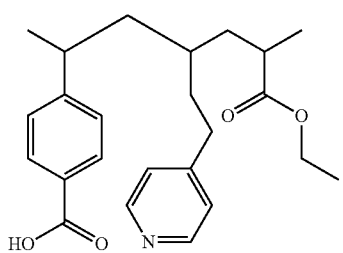

18. A method for lithography patterning, comprising:
   forming a first photosensitive layer on a substrate;
   forming a blocking layer on the first photosensitive layer, the blocking layer including a reactive monomer that is capable to bond to a top surface of the first photosensitive layer;
   forming a second photosensitive layer on the blocking layer;
   performing a first exposing process to the second photosensitive layer;
   developing the second photosensitive layer, thereby forming a patterned second photosensitive layer;
   performing a second exposing process to the first photosensitive layer through openings in the patterned second photosensitive layer;
   developing the first photosensitive layer, thereby forming a patterned first photosensitive layer; and
   transferring a pattern to the substrate using at least the patterned first photosensitive layer as a mask.

19. The method of claim 18, wherein the reactive monomer includes a chelate group.

20. The method of claim 18, wherein the reactive monomer is capable to bond to the top surface of the first photosensitive layer by creating chemical bonds.

* * * * *